US012035595B2

(12) United States Patent
Cho et al.

(10) Patent No.: US 12,035,595 B2
(45) Date of Patent: Jul. 9, 2024

(54) DISPLAY APPARATUS

(71) Applicant: Samsung Display Co., Ltd., Yongin-si (KR)

(72) Inventors: Seung-Hwan Cho, Yongin-si (KR); Jong-Hyun Choi, Seoul (KR); Ju-Chan Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 694 days.

(21) Appl. No.: 17/261,527

(22) PCT Filed: Jul. 12, 2019

(86) PCT No.: PCT/KR2019/008669
§ 371 (c)(1),
(2) Date: Jan. 19, 2021

(87) PCT Pub. No.: WO2020/017835
PCT Pub. Date: Jan. 23, 2020

(65) Prior Publication Data
US 2021/0273035 A1 Sep. 2, 2021

(30) Foreign Application Priority Data

Jul. 19, 2018 (KR) .................. 10-2018-0083825

(51) Int. Cl.
H10K 59/131 (2023.01)
H10K 59/126 (2023.01)
(Continued)

(52) U.S. Cl.
CPC ....... *H10K 59/1315* (2023.02); *H10K 59/126* (2023.02); *H10K 77/111* (2023.02); *H10K 2102/311* (2023.02)

(58) Field of Classification Search
None
See application file for complete search history.

(56) References Cited

U.S. PATENT DOCUMENTS 8,537,320 B2  9/2013 Kwon et al.
9,430,180 B2  8/2016 Hirakata et al.
(Continued)

FOREIGN PATENT DOCUMENTS

CN  108172594 A  6/2018
GB  2 420 651 A  5/2006
(Continued)

OTHER PUBLICATIONS

Machine-generated English translation of KR 20180078672 (Year: 2018).*

(Continued)

*Primary Examiner* — Bo B Jang
(74) *Attorney, Agent, or Firm* — Lewis Roca Rothgerber Christie LLP

(57) ABSTRACT

A display apparatus including a display area for displaying an image and a peripheral area that is a non-display area includes a base substrate, a first data line disposed in the display area on the base substrate, a first connecting line at least partially disposed in the display area on the base substrate and electrically connected to the first data line through a connection contact hole, a data pad disposed in the peripheral area, and a first data spider line disposed in the peripheral area between the data pad and the display area and electrically connected to the first connecting line and the data pad.

20 Claims, 16 Drawing Sheets

(51) Int. Cl.
*H10K 77/10* (2023.01)
*H10K 102/00* (2023.01)

(56) References Cited

U.S. PATENT DOCUMENTS

| | | |
|---|---|---|
| 11,678,538 B2 | 6/2023 | Yamazaki et al. |
| 2006/0113903 A1* | 6/2006 | Kim .................. H10K 59/131 |
| | | 313/506 |
| 2009/0096975 A1* | 4/2009 | Kwon .................. G02F 1/1345 |
| | | 349/139 |
| 2010/0133988 A1 | 6/2010 | Kim |
| 2017/0047347 A1 | 2/2017 | Kim et al. |
| 2017/0154579 A1 | 6/2017 | Choi et al. |
| 2018/0039146 A1 | 2/2018 | Tanaka et al. |
| 2018/0130856 A1 | 5/2018 | Kim et al. |
| 2019/0278145 A1 | 9/2019 | Tanaka et al. |
| 2020/0161411 A1 | 5/2020 | Lee et al. |

FOREIGN PATENT DOCUMENTS

| | | |
|---|---|---|
| JP | 2003-288044 A | 10/2003 |
| JP | 2014-197181 A | 10/2014 |
| KR | 10-2006-0001702 A | 1/2006 |
| KR | 10-2009-0038670 A | 4/2009 |
| KR | 10-2010-0075058 A | 7/2010 |
| KR | 10-1602332 B1 | 3/2016 |
| KR | 10-2018-0030325 A | 3/2018 |
| KR | 10-2018-0078672 A | 7/2018 |
| WO | WO 2016/140281 A1 | 9/2016 |
| WO | WO 2018/062023 A1 | 4/2018 |

OTHER PUBLICATIONS

International Search Report Corresponding to PCT/KR2019/008669, dated Oct. 15, 2019, 4 pps. (Applicant is including the ISR for the File History—previously cited on Jan. 19, 2021).
International Search Report corresponding to PCT/KR2019/008669, dated Oct. 15, 2019, 4 pages.

* cited by examiner

DISPLAY APPARATUS

CROSS-REFERENCE TO RELATED APPLICATION

This application is a U.S. National Phase Patent Application of International Application Number PCT/KR2019/008669, filed on Jul. 12, 2019, which claims priority to Korean Patent Application Number 10-2018-0083825, filed on Jul. 19, 2018, the entire content of all of which is incorporated herein by reference.

TECHNICAL FIELD

Embodiments relate generally to a display apparatus. More particularly, embodiments of the present disclosure relate to a display apparatus in which a width of a peripheral area that is a non-display area is reduced.

BACKGROUND

Recently, as the technology improves, display products having smaller sizes, lighter weights, and superior performance have been produced. Conventional cathode ray tube (CRT) televisions have been widely used for display apparatuses with many advantages in terms of performance and price. Recently, however, a display apparatus such as a plasma display apparatus, a liquid crystal display apparatus, and an organic light emitting diode display apparatus that overcomes weak points of the CRT in terms of miniaturization or portability and has advantages such as miniaturization, light weight, and low power consumption has been spotlighted.

The display apparatus includes a display area for displaying an image, and a peripheral area that is a non-display area around the display area. In this case, efforts have been made to reduce a width of the peripheral area.

SUMMARY

Embodiments provide a display apparatus in which a width of a peripheral area that is a non-display area is reduced.

According to embodiments, a display apparatus including a display area for displaying an image and a peripheral area that is a non-display area may include a base substrate, a first data line disposed in the display area on the base substrate, a first connecting line at least partially disposed in the display area on the base substrate and electrically connected to the first data line through a connection contact hole, a data pad disposed in the peripheral area, and a first data spider line disposed in the peripheral area between the data pad and the display area and electrically connected to the first connecting line and the data pad.

In embodiments, the base substrate may be a flexible substrate. In addition, the display apparatus may further include a bending area disposed between the data pad and the display area and extending in a first direction parallel to an edge of the display area. Further, the first data spider line may be disposed in the peripheral area between the bending area and the display area and may linearly extend in a second direction perpendicular to the first direction.

In embodiments, a length of the bending area in the first direction may be smaller than a length of the display area in the first direction.

In embodiments, the display apparatus may further include a plurality of data lines disposed in the display area on the base substrate and extending parallel to the first data line, and a plurality of data spider lines disposed in the peripheral area between the data pad and the display area, electrically connected to the data lines, respectively, and extending parallel to the first data spider line. In addition, both the first data spider line and the data spider lines may extend in the second direction.

In embodiments, the connection contact hole may be disposed in the peripheral area.

In embodiments, the first data line may extend in a second direction perpendicular to a first direction. In addition, the first connecting line may include a first portion extending in the second direction, a second portion connected to the first portion and extending in the first direction, and a third portion parallel to the first portion.

In embodiments, the connection contact hole may be disposed in the display area.

In embodiments, the display apparatus may further include a second data line disposed in the display area on the base substrate while being adjacent to the first data line. In addition, the first and second data lines may be connected to each other in the peripheral area and electrically connected to the first connecting line.

In embodiments, the display apparatus may further include an $(n-1)^{th}$ data line, an $n^{th}$ data line, and an $(n+1)^{th}$ data line that are parallel to the first data line and sequentially arranged in the first direction. In addition, an $n^{th}$ pad electrically connected to the $n^{th}$ data line, an $(n-1)^{th}$ pad electrically connected to the $(n-1)^{th}$ data line, an $(n+1)^{th}$ pad electrically connected to the $(n+1)^{th}$ data line, and a first pad electrically connected to the first data line may be disposed in the data pad in the first direction.

In embodiments, the display apparatus may further include an $(n-1)^{th}$ connecting line at least partially disposed in the display area on the base substrate and electrically connected to the $(n-1)^{th}$ data line through a connection contact hole, an $(n-1)^{th}$ data spider line disposed in the peripheral area between the data pad and the display area and electrically connected to the $(n-1)^{th}$ connecting line and the data pad, an $n^{th}$ data spider line disposed in the peripheral area between the data pad and the display area and electrically connected to the $n^{th}$ data line and the data pad, and an $(n+1)^{th}$ data spider line disposed in the peripheral area between the data pad and the display area and electrically connected to the $(n+1)^{th}$ data line and the data pad.

In embodiments, the peripheral area may include a left peripheral area adjacent to a left side of the display area, a right peripheral area adjacent to a right side of the display area, an upper peripheral area adjacent to an upper side of the display area, and a lower peripheral area adjacent to a lower side of the display area. In addition, the data pad may be disposed in the lower peripheral area.

In embodiments, the display apparatus may further include a thin film transistor electrically connected to the first data line, a first electrode electrically connected to the thin film transistor, a second electrode disposed over the first electrode, and a light emitting layer disposed between the first electrode and the second electrode.

In embodiments, the display apparatus may further include a shielding electrode that overlaps the first connecting line. In addition, a first power or a second power may be applied to the shielding electrode.

In embodiments, the first connecting line and the first data spider line may be connected to each other through a spider contact hole formed in the peripheral area.

According to embodiments, a display apparatus may include a base substrate, a thin film transistor disposed on the base substrate, a first data line electrically connected to the thin film transistor, a first connecting line electrically connected to the first data line, a first insulating layer disposed between the first data line and the first connecting line and having a first connection contact hole through which the first data line and the first connecting line are connected to each other, and a shielding electrode that overlaps the first connecting line.

In embodiments, the thin film transistor may include an active pattern disposed on the base substrate and a gate electrode that overlaps the active pattern. In addition, the display apparatus may further include a first data spider line formed on a same layer as the gate electrode and electrically connected to the first connecting line.

In embodiments, the shielding electrode may be disposed between the thin film transistor and the first connecting line.

In embodiments, the shielding electrode may overlap the first data line.

In embodiments, the display apparatus may further include a second data line adjacent to the first data line and extending parallel to the first data line. In addition, the first data line and the second data line may be electrically connected to the first connecting line. Further, the shielding electrode may overlap the first data line and the second data line.

According to embodiments, a display apparatus may include a base substrate, first and second data lines disposed on the base substrate, a first connecting line connected to the first data line through a contact hole, a first data spider line connected to the first connecting line through a contact hole, a second data spider line connected to the second data line through a contact hole, and a data pad electrically connected to the first data spider line and the second data spider line and connected to a data driving chip.

Therefore, a display apparatus according to embodiments may include a display area for displaying an image and a peripheral area that is a non-display area. The display apparatus may include a base substrate, a first data line disposed in the display area on the base substrate, a first connecting line at least partially disposed in the display area on the base substrate and electrically connected to the first data line through a connection contact hole, a data pad disposed in the peripheral area, and a first data spider line disposed in the peripheral area between the data pad and the display area and electrically connected to the first connecting line and the data pad. Since the first connecting line is disposed in the display area other than the peripheral area, a display apparatus in which a width of the peripheral area is reduced to reduce a bezel portion, which is a non-display area, can be implemented.

However, the effects of the present disclosure are not limited thereto. Thus, the effects of the present disclosure may be extended without departing from the spirit and the scope of the present disclosure.

DETAILED DESCRIPTION

Hereinafter, embodiments of the present disclosure will be explained in detail with reference to the accompanying drawings.

Figure 1:
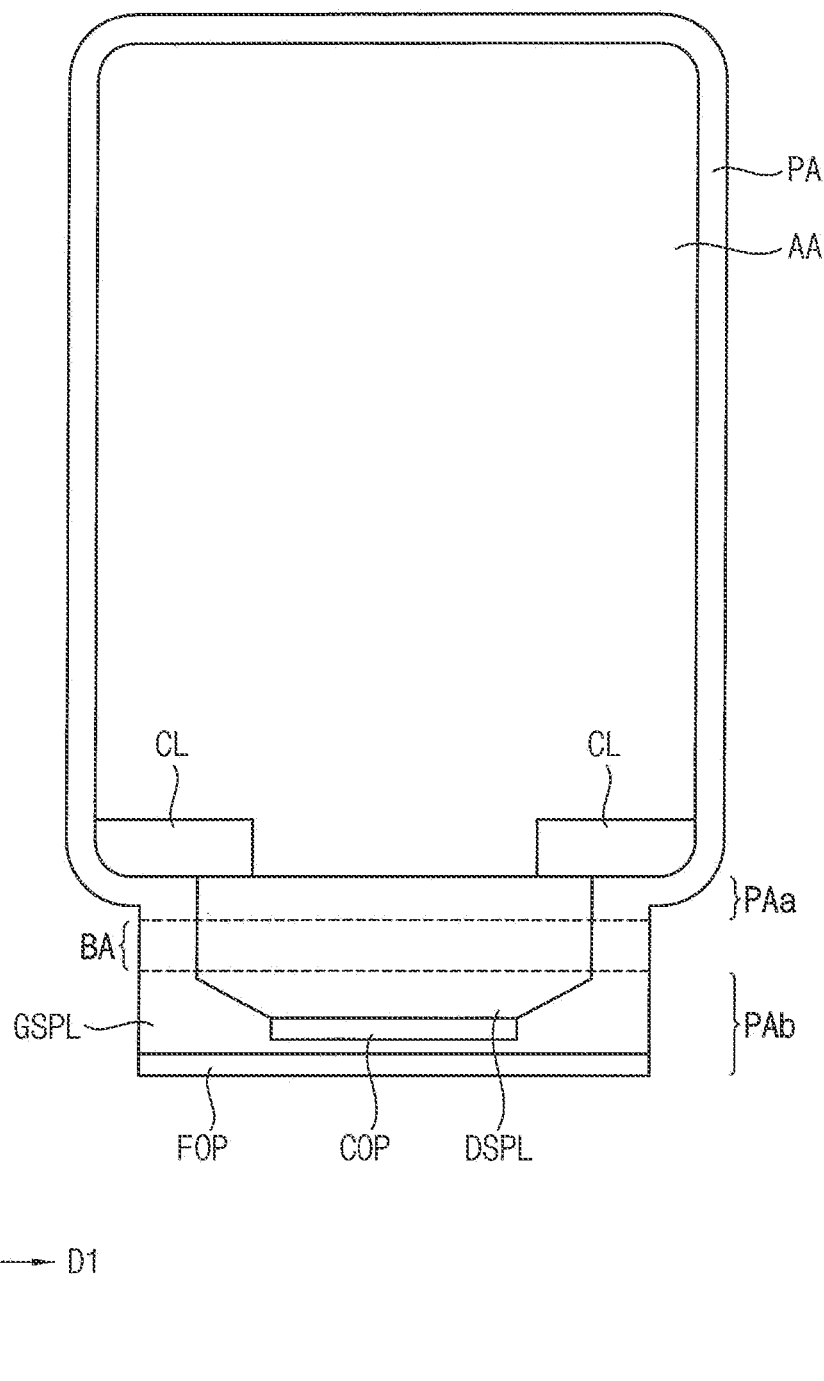
FIG. 1 is a plan view showing a display apparatus according to embodiments.

FIG. 1 is a plan view showing a display apparatus according to embodiments.

Referring to FIG. 1, a display apparatus may include a display area AA for displaying an image, and a peripheral area PA that is a non-display area adjacent to the display area AA and surrounding the display area AA. The display area AA may have a rectangular shape on a plane defined by a first direction D1 and a second direction D2 perpendicular to the first direction D1, and a corner of the display area AA may have a round shape. In some embodiments, the display area AA may have a rectangular shape including rounded corners, but embodiments are not limited thereto.

The peripheral area PA may include: a left peripheral area adjacent to a left side of the display area AA; a right peripheral area adjacent to a right side of the display area AA; an upper peripheral area adjacent to an upper side of the display area AA; and a lower peripheral area adjacent to a lower side of the display area AA.

In this case, a data pad COP and a gate pad FOP for connecting a driver may be disposed in the lower peripheral area, so that the lower peripheral area may have a width greater than a width of each of the upper, left, and right peripheral areas. The lower peripheral area may include: a first peripheral area PAa directly adjacent to the display area AA; a bending area BA; and a second peripheral area PAb. The data pad COP and the gate pad FOP may be disposed in the second peripheral area PAb.

The bending area BA may be a portion folded to place the second peripheral area PAb on a rear surface of the display apparatus, and the bending area BA may be disposed between the first peripheral area PAa and the second peripheral area PAb.

In this case, a length of the bending area BA in the first direction D1 may be smaller than a length of the display area AA in the first direction D1. Accordingly, data lines, which are located outward in the first direction D1 compared to a data spider line DSPL disposed in the lower peripheral area, may be connected to the data spider line DSPL through a connecting line CL.

The data spider line DSPL may be electrically connected to a data line disposed in the display area AA and to the data pad COP. Meanwhile, a gate spider line GSPL connected to a scan driver or a data driver and connected to the gate pad FOP may be disposed at a portion adjacent to the data spider line DSPL in the lower peripheral area.

A chip including the data driver may be connected to the data pad COP. A driving substrate including a timing controller may be connected to the gate pad FOP.

Figure 2:
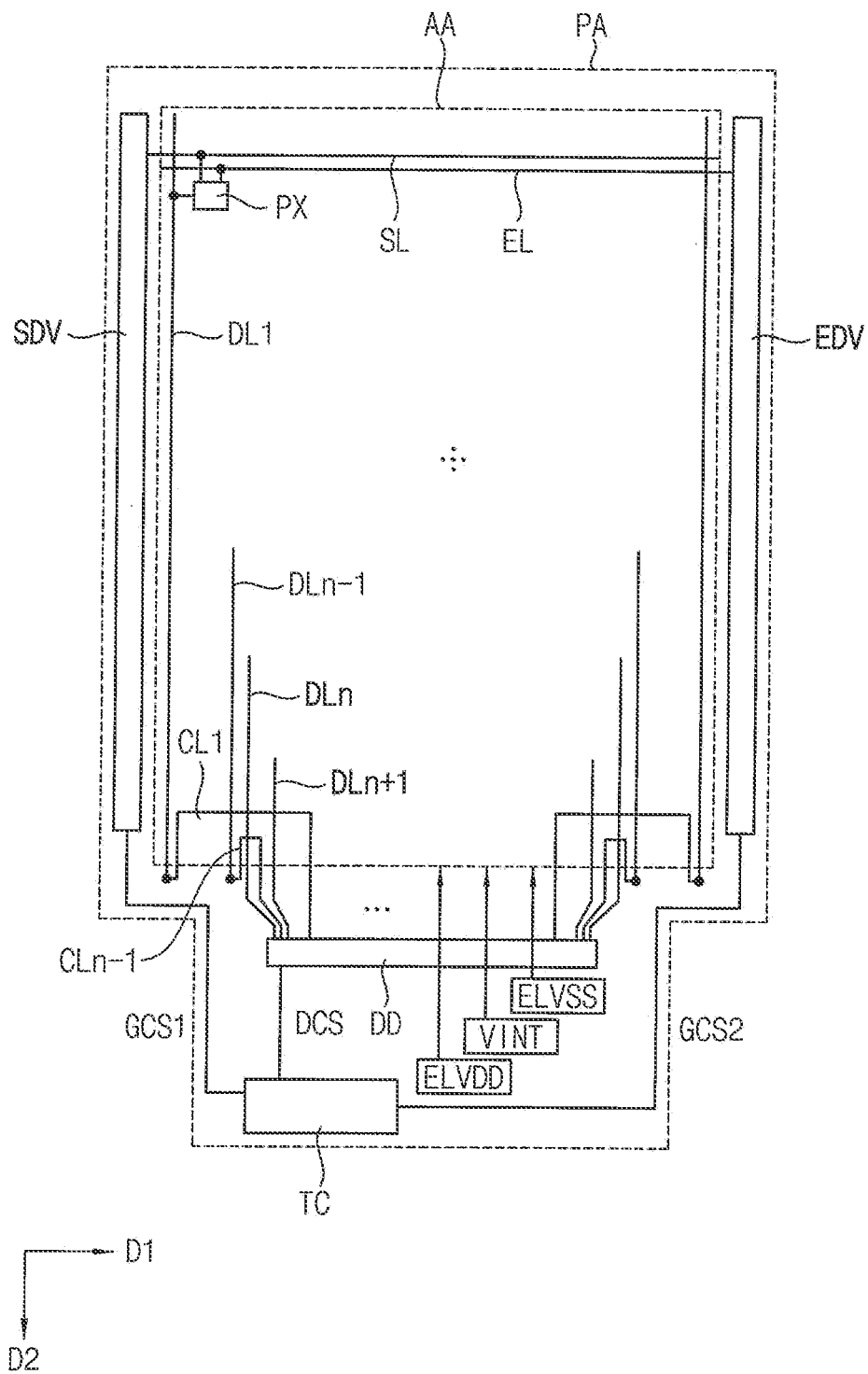
FIG. 2 is a block diagram illustrating an example of pixels and drivers included in the display apparatus of FIG. 1.
Figure 3:
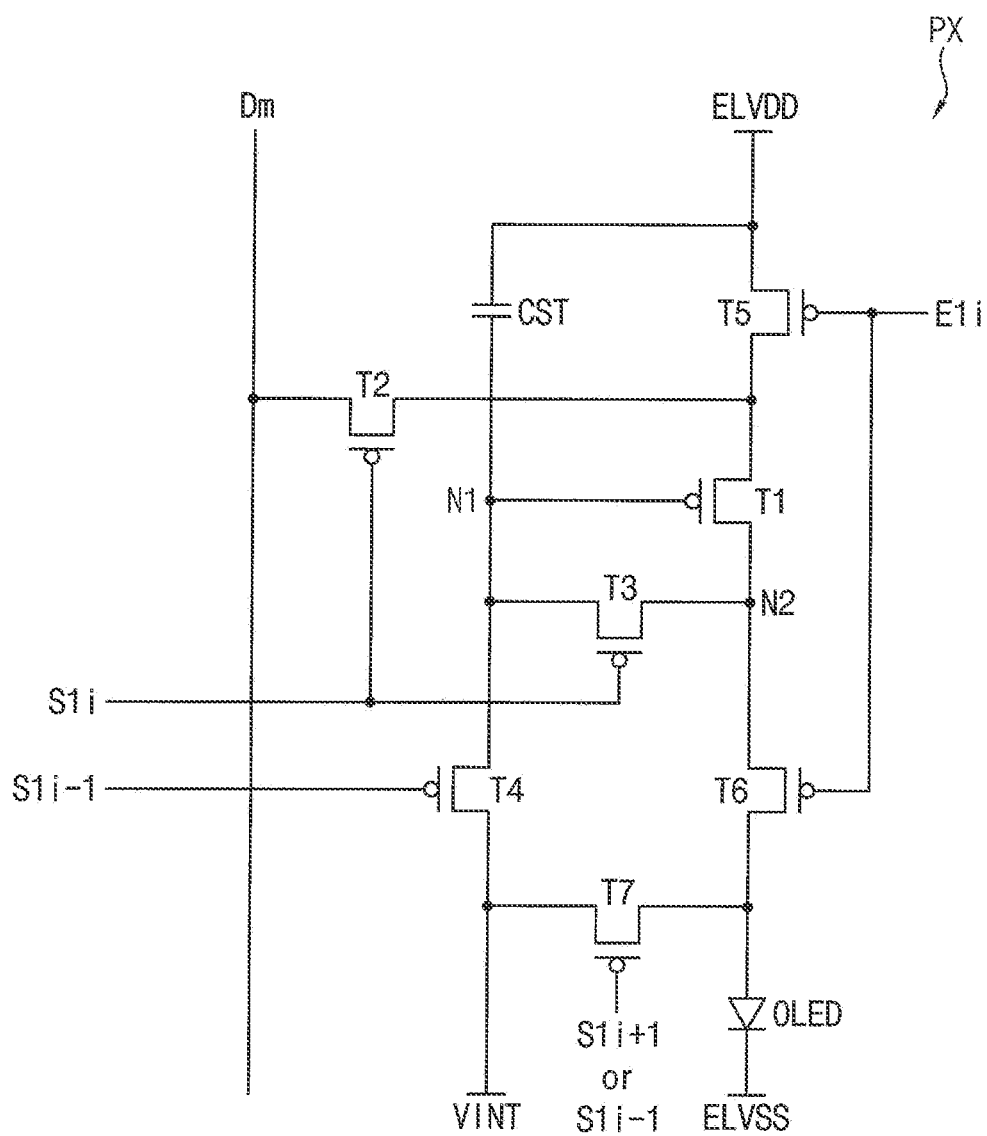
FIG. 3 is a diagram illustrating an example of a pixel shown in FIG. 2.
Figure 4:
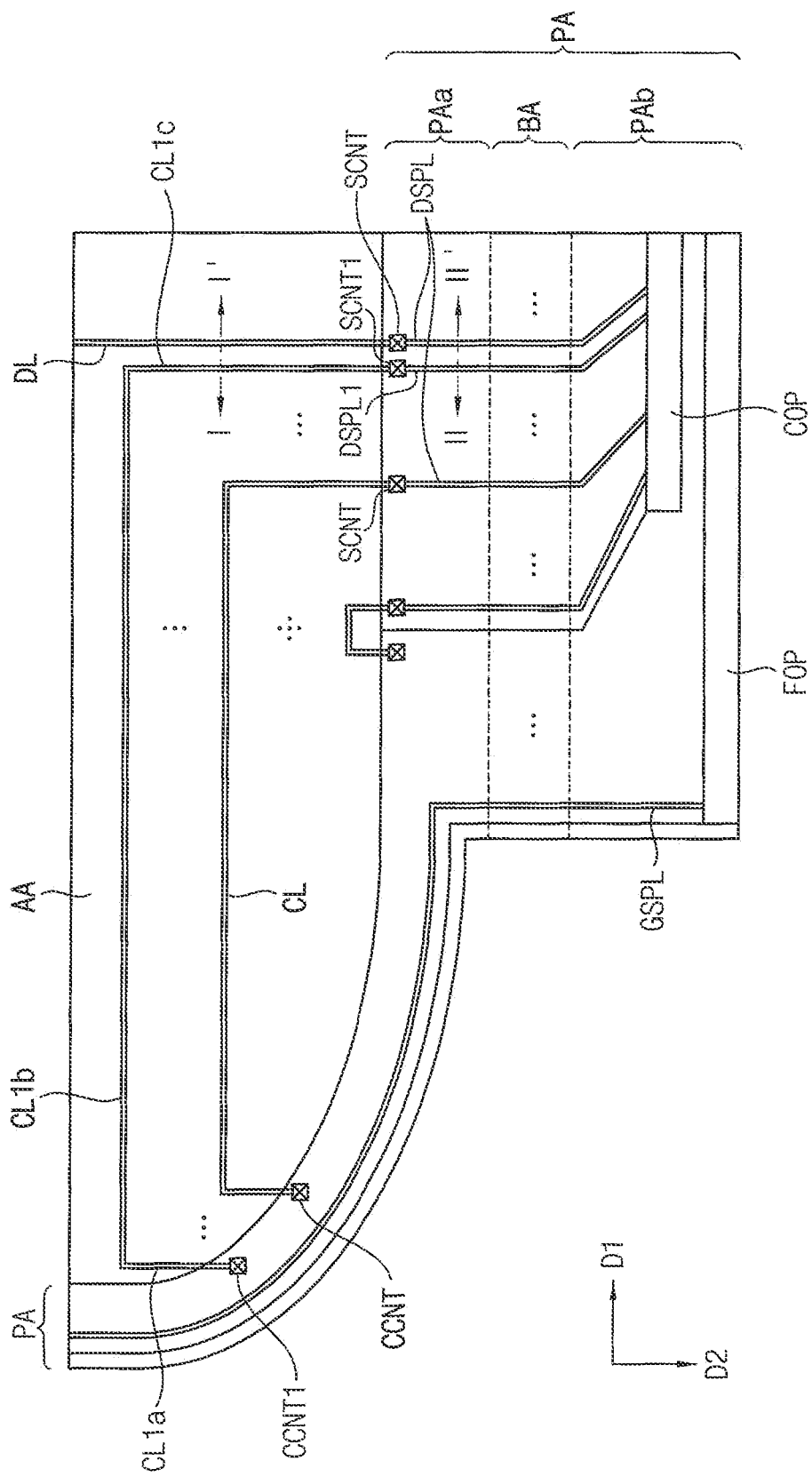
FIG. 4 is an enlarged view showing a lower left portion of the display apparatus of FIG. 1.
Figure 5:
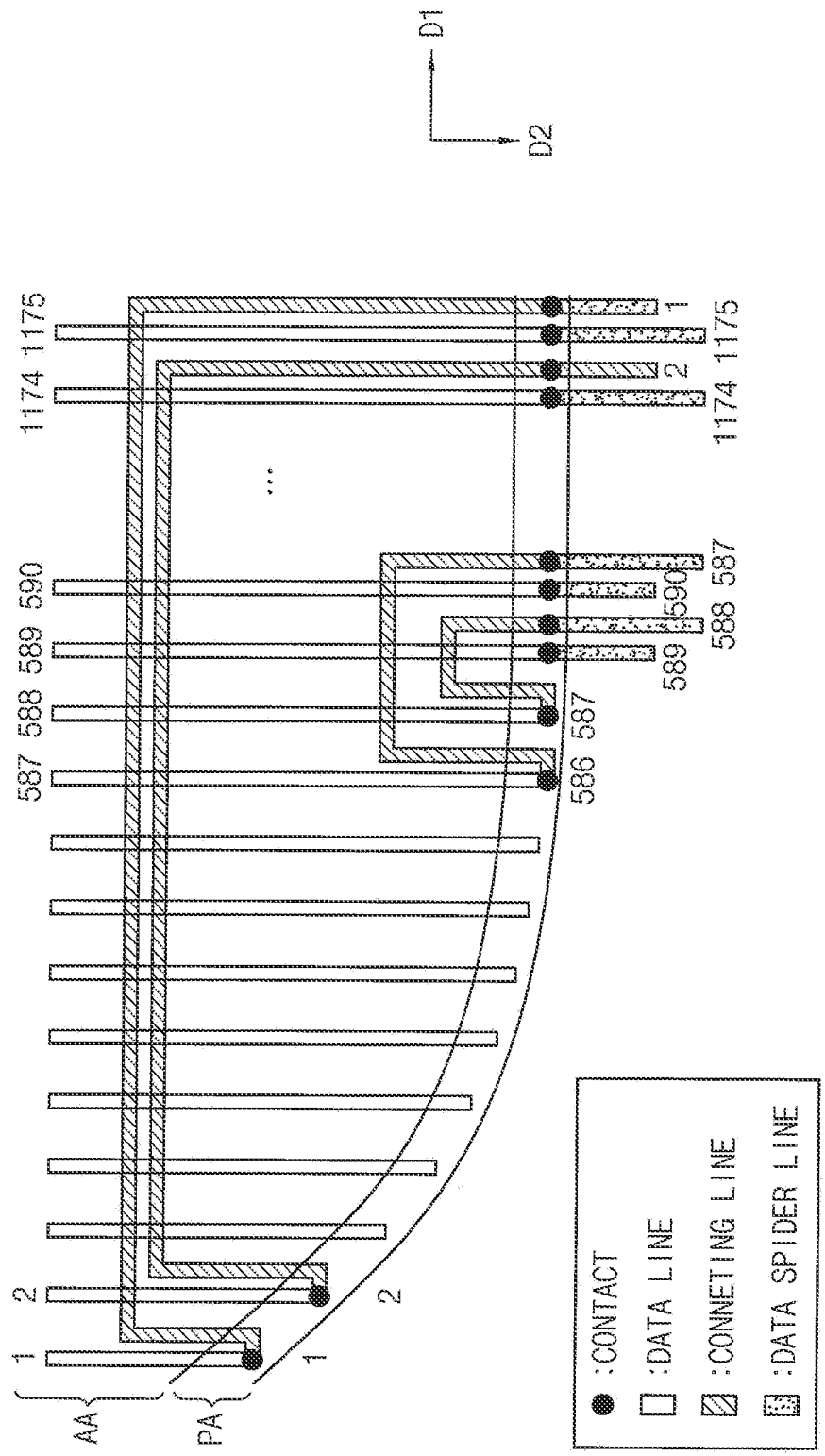
FIG. 5 is a diagram for describing a connection relation between a data line and a connecting line of the display apparatus of FIG. 4.

FIG. 2 is a block diagram illustrating an example of pixels and drivers included in the display apparatus of FIG. 1, FIG. 3 is a diagram illustrating an example of a pixel shown in FIG. 2, FIG. 4 is an enlarged view showing a lower left portion of the display apparatus of FIG. 1, and FIG. 5 is a diagram for describing a connection relation between a data line and a connecting line of the display apparatus of FIG. 4.

Referring to FIGS. 1 to 5, the display apparatus may include a plurality of pixels PX, a driver, and a wire part.

The driver may include a scan driver SDV, an emission driver EDV, a data driver DD, and a timing controller TC. In FIG. 2, positions of the scan driver SDV, the emission driver EDV, the data driver DD, and the timing controller TC are set for convenience of description, and the scan driver SDV, the emission driver EDV, the data driver DD, and the timing controller TC may be disposed at different positions in the display apparatus when implementing an actual display apparatus.

The wire part may provide a signal of the driver to each pixel PX, and may include scan lines SL, data lines DL1, ..., DLn−1, DLn, DLn+1, ..., emission control lines EL, first and second power lines (not shown), and an initialization power line (not shown).

Each pixel PX may be electrically connected to a scan line, a data line, and an emission control line.

When scan signals are supplied from the scan lines SL, the pixels PX may receive data signals from the data lines DL1, ..., DLn−1, DLn, DLn+1, .... The pixels PX that have received the data signals may control an amount of a current flowing from a first power ELVDD to a second power ELVSS via an organic light emitting diode OLED.

The scan driver SDV may supply the scan signals to the scan lines SL in response to a first gate control signal GCS1 received from the timing controller TC. When the scan signals are sequentially supplied to the scan lines SL, the pixels PX may be sequentially selected in a unit of a horizontal line.

The emission driver EDV may supply emission control signals to the emission control lines EL in response to a second gate control signal GCS2 received from the timing controller TC. The emission driver EDV may sequentially supply the emission control signals to the emission control lines EL.

In addition, the emission control signal may be set to a gate-off voltage (e.g., a high voltage) so that transistors included in the pixels PX may be turned off, and the scan signal may be set to a gate-on voltage (e.g., a low voltage) so that other transistors included in the pixels PX may be turned on.

The data driver DD may supply the data signals to the data lines DL1, ..., DLn−1, DLn, DLn+1, ... in response to a data control signal DCS. The data signals supplied to the data lines DL1, ..., DLn−1, DLn, DLn+1, ... may be supplied to the pixels PX selected by the scan signal.

The timing controller TC may supply the first and second gate control signals GCS1 and GCS2, which are generated based on timing signals supplied from an outside, to the scan driver SDV and the emission driver EDV, and may supply the data control signal DCS to the data driver DD.

Each of the first and second gate control signals GCS1 and GCS2 may include a start pulse and clock signals. The start pulse may control timing of a first scan signal or a first emission control signal. The clock signals may be used to shift the start pulse.

The data control signal DCS may include a source start pulse and clock signals. The source start pulse may control a data sampling start point. The clock signals may be used to control a sampling operation.

In this case, the data line may include a first data line DL1, an $(n-1)^{th}$ data line DLn−1, an $n^{th}$ data line DLn, and an $(n+1)^{th}$ data line DLn+1.

The first data line DL1, the $(n-1)^{th}$ data line DLn−1, the $n^{th}$ data line DLn, and the (n+1) h data line DLn+1 may be arranged in the first direction D1, and may extend in the second direction D2 perpendicularly to the first direction D1.

The data line may be connected to the connecting line CL through a connection contact hole CCNT, and the connecting line CL may be connected to the data spider line DSPL through a spider contact hole SCNT; or the data line may be directly connected to the data spider line DSPL through the spider contact hole SCNT.

Figure 9:
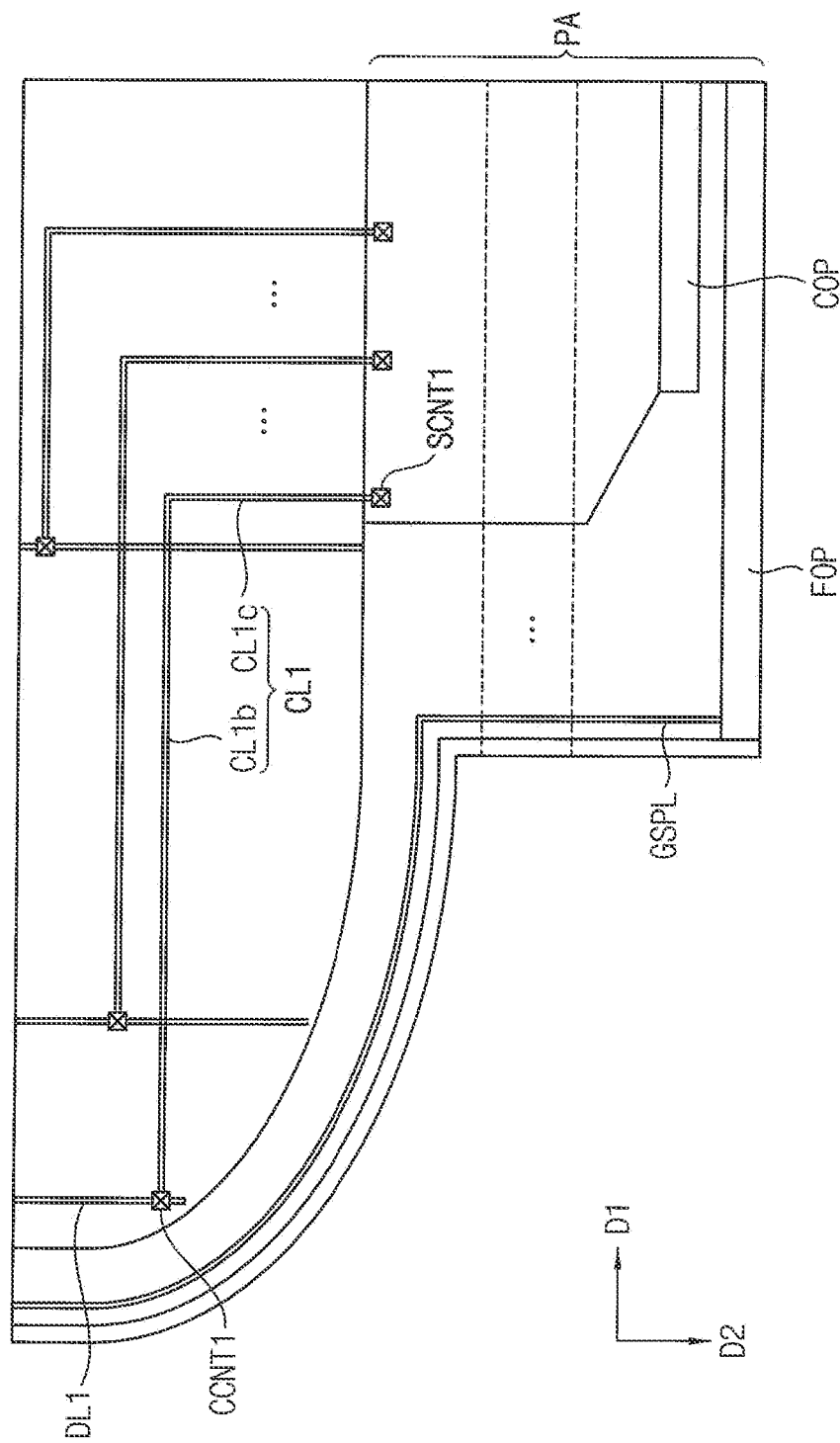
FIG. 9 is an enlarged view showing a lower left portion of a display apparatus according to embodiments.

For example, as also shown in FIG. 9, the first data line DL1 may be connected to the first connecting line CL1 through a first connection contact hole CCNT1. The first connection contact hole CCNT1 may be formed in the peripheral area PA. The first connecting line CL1 may pass through the display area AA, and may be connected to a first data spider line DSPL1 through a first spider contact hole SCNT1 in the peripheral area PA. In this case, the first connecting line CL1 may include: a first portion CL1a extending in the second direction D2; a second portion CL1b connected to the first portion CL1a and extending in the first direction D1; and a third portion CL1c parallel to the first portion CL1a.

The $(n-1)^{th}$ data line DLn−1 may be connected to an $(n-1)^{th}$ connecting line CLn−1 through a connection contact hole CCNT in the peripheral area PA at the lower side of the display area AA. The $(n-1)^{th}$ connecting line CLn−1 may pass through the display area AA, and may be connected to a data spider line DSPL through a spider contact hole SCNT in the peripheral area PA.

Meanwhile, the $n^{th}$ data line DLn and the $(n+1)^{th}$ data line DLn+1 may be respectively directly connected to a corresponding data spider line DSPL through a corresponding spider contact hole SCNT in the peripheral area PA without passing through the connecting line. FIG. 5 conceptually shows a case where n is 589.

In this case, each of the data spider lines DSPL1 and DSPL may extend in the second direction while being parallel to each other in the peripheral area PA between the bending area BA and the display area AA. Accordingly, compared to a conventional technology in which the data spider lines DSPL1 and DSPL are bent at a predetermined angle with respect to the second direction D2, a sufficient distance between the data spider lines DSPL1 and DSPL may be ensured, so that wire resistances of the data spider lines DSPL1 and DSPL may be reduced.

According to some embodiments, the display apparatus includes a display area for displaying an image, and a peripheral area that is a non-display area. The display apparatus includes: a base substrate; a first data line disposed in the display area on the base substrate; a first connecting line at least partially disposed in the display area on the base substrate and electrically connected to the first data line through a connection contact hole; a data pad disposed in the peripheral area; and a first data spider line disposed in the peripheral area between the data pad and the display area and electrically connected to the first connecting line and the data pad. Since the first connecting line is disposed in the display area other than the peripheral area, a display apparatus in which a width of the peripheral area is reduced to thereby reduce a bezel portion, which is a non-display area, can be implemented.

Meanwhile, although some embodiments have been described in which the scan driver SDV is disposed in the peripheral area PA adjacent to the left side of the display area AA, and the emission driver EDV is disposed in the peripheral area PA adjacent to the right side of the display area AA, other embodiments are not limited thereto. For example, the scan driver and the emission driver connected to each other by the scan line, and the emission control line may be disposed in both the left and right peripheral areas, so that signals synchronized with each other may be supplied to the pixels from the left and right sides.

Referring again to FIG. 3, for convenience of description, a pixel connected to an $m^{th}$ data line Dm and an $i^{th}$-first scan line S1$i$ will be illustrated.

According to some embodiments of the present disclosure, the pixel PX may include an organic light emitting diode OLED, first to seventh transistors T1 to T7, and a storage capacitor CST.

The organic light emitting diode OLED may include an anode connected to the first transistor T1 via the sixth transistor T6, and a cathode connected to the second power ELVSS. The organic light emitting diode OLED may generate light having a luminance in response to an amount of a current supplied from the first transistor T1.

The first power ELVDD may be set as a voltage that is higher than a voltage of the second power ELVSS so that the current may flow through the organic light emitting diode OLED.

The seventh transistor 17 may be connected between an initialization power VINT and the anode of the organic light emitting diode OLED. In addition, a gate electrode of the seventh transistor 17 may be connected to an $(i+1)^{th}$-first scan line S1$i$+1 or an $(i-1)^{th}$-first scan line S1$i$−1. The seventh transistor 17 may be turned on when a scan signal is supplied to the $i^{th}$-first scan line S1$i$ so that a voltage of the initialization power VINT may be supplied to the anode of the organic light emitting diode OLED. In this case, the initialization power VINT may be set as a voltage that is lower than a voltage of a data signal.

The sixth transistor T6 may be connected between the first transistor T1 and the organic light emitting diode OLED. In addition, a gate electrode of the sixth transistor T6 may be connected to an $i^{th}$-first emission control line E1$i$. The sixth transistor T6 may be turned off when an emission control signal is supplied to the $i^{th}$-first emission control line E1$i$, and may be turned on in other cases.

The fifth transistor T5 may be connected between the first power ELVDD and the first transistor T1. In addition, a gate electrode of the fifth transistor T5 may be connected to the $i^{th}$-first emission control line E1$i$. The fifth transistor T5 may be turned off when the emission control signal is supplied to the $i^{th}$-first emission control line E1$i$, and may be turned on in other cases.

The first transistor T1 (a driving transistor) may include a first electrode connected to the first power ELVDD via the fifth transistor T5, and a second electrode connected to the anode of the organic light emitting diode OLED via the sixth transistor T6. In addition, a gate electrode of the first transistor T1 may be connected to a first node N1. The first transistor T1 may control an amount of a current flowing from the first power ELVDD to the second power ELVSS via the organic light emitting diode OLED in response to a voltage of the first node N1.

The third transistor T3 may be connected between the second electrode of the first transistor T1 and the first node N1. In addition, a gate electrode of the third transistor T3 may be connected to the $i^{th}$-first scan line S1$i$. The third transistor T3 may be turned on when the scan signal is supplied to the $i^{th}$-first scan line S1$i$ so that the second electrode of the first transistor T1 may be electrically connected to the first node N1. Accordingly, when the third transistor T3 is turned on, the first transistor T1 may be connected in the form of a diode.

The fourth transistor T4 may be connected between the first node N1 and the initialization power VINT. In addition, a gate electrode of the fourth transistor T4 may be connected to the $(i-1)^{th}$-first scan line S1$i$−1. The fourth transistor T4 may be turned on when the scan signal is supplied to the $(i-1)^{th}$-first scan line S1$i$−1 so that the voltage of the initialization power VINT may be supplied to the first node N1.

The second transistor T2 may be connected between the $m^{th}$ data line Dm and the first electrode of the first transistor T1. In addition, a gate electrode of the second transistor T2 may be connected to the $i^{th}$-first scan line S1$i$. The second transistor T2 may be turned on when the scan signal is supplied to the $i^{th}$-first scan line S1$i$ so that the $m^{th}$ data line Dm may be electrically connected to the first electrode of the first transistor T1.

The storage capacitor CST may be connected between the first power ELVDD and the first node N1. The storage capacitor CST may store the data signal and a voltage corresponding to a threshold voltage of the first transistor T1.

Figure 6:
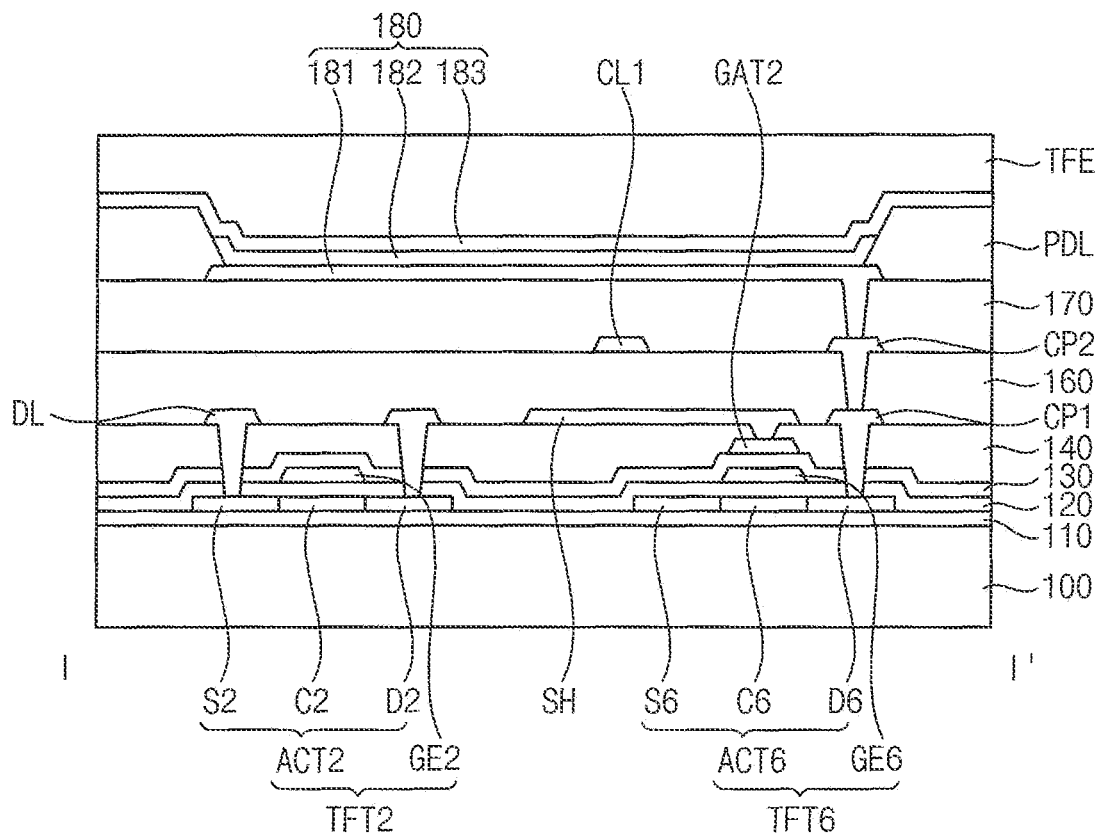
FIG. 6 is a sectional view showing the display apparatus taken along line I-I' of FIG. 4.
Figure 7:
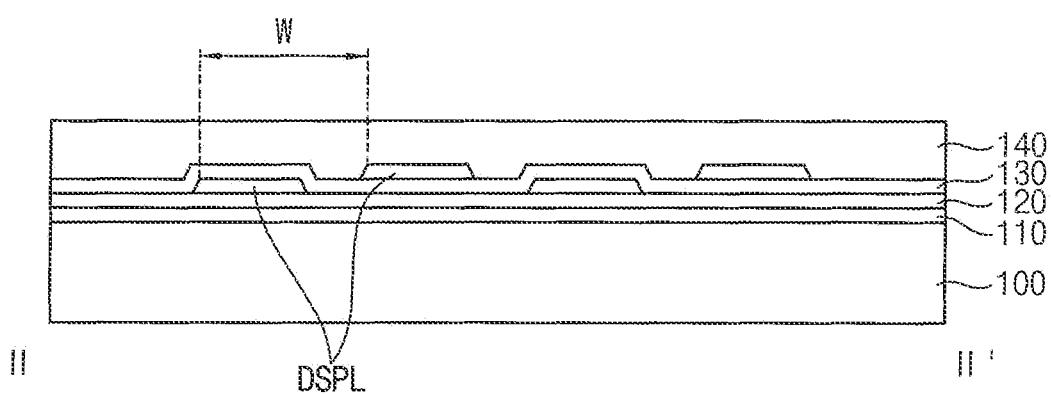
FIG. 7 is a sectional view showing some layers of the display apparatus taken along line II-II' of FIG. 4.

FIG. 6 is a sectional view showing the display apparatus taken along line I-I' of FIG. 4, and FIG. 7 is a sectional view showing some layers of the display apparatus taken along line II-II' of FIG. 4.

Referring to FIGS. 4 to 7, the display apparatus may include a base substrate 100, a buffer layer 110, an active pattern ACT, a first gate insulating layer 120, a first gate pattern, a second gate insulating layer 130, a second gate pattern GAT2, an interlayer insulating layer 140, a first data pattern, a first insulating layer 160, a connecting line pattern, a second insulating layer 170, a pixel defining layer PDL, a light emitting structure 180, and a thin film encapsulation layer TFE.

The base substrate 100 may include a transparent insulating substrate. For example, the base substrate 100 may be a transparent resin substrate having flexibility. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, and the like. Preferably, the base substrate 100 may be a polyimide (PI) resin film.

The buffer layer 110 may prevent metal atoms or impurities from diffusing from the base substrate 100, and may control a heat transfer rate during a crystallization process for forming the active pattern ACT, which will be described below, to obtain a substantially uniform active pattern ACT. In addition, when a surface of the base substrate 100 is not uniform, the buffer layer 110 may serve to improve flatness of the surface of the base substrate 100. The buffer layer 110 may be formed by using a silicon compound such as silicon oxide ($SiO_x$), silicon nitride ($SiN_x$), silicon oxynitride ($SiO_xN_y$), silicon oxycarbide ($SiO_xC_y$), and silicon carbonitride ($SiC_xN_y$).

The buffer layer 110 may not be formed in the bending area BA of the peripheral area PA. In other words, the buffer layer 110 may not be formed in the bending area BA, or may be removed from the bending area BA. This is because the bending area BA is a portion that is folded in a final product, and when the buffer layer 110, which is an inorganic layer, is formed in the bending area BA, damage such as a crack may occur in the buffer layer 110. Similarly, the insulating layers 120, 130, and the like, which are formed of an inorganic film, may not be formed in the bending area BA.

The active pattern ACT may be disposed on the buffer layer 110. The active pattern ACT may include active patterns ACT2 and ACT6 of thin film transistors TFT2 and TFT6 that are disposed in the display area AA to constitute a pixel structure, and an active pattern (not shown) disposed in the peripheral area PA to constitute a driving circuit. The driving circuit may be an amorphous silicon gate (ASG) circuit.

The active patterns ACT2 and ACT6 of the thin film transistors TFT2 and TFT6 may include drain regions D2 and D6 and source regions S2 and S6, which are doped with impurities, and channel regions C2 and C6 disposed between the drain regions D2 and D6 and the source regions S2 and S6, respectively. The thin film transistors TFT2 and TFT6 may be the second transistor and the sixth transistor of FIG. 3, respectively.

The first gate insulating layer 120 may be disposed on the buffer layer 110 on which the active patterns ACT2 and ACT6 are disposed. The first gate insulating layer 120 may include a silicon compound, metal oxide, and the like.

The first gate pattern may be disposed on the first gate insulating layer 120. The first gate pattern may include: gate electrodes GE2 and GE6 of the thin film transistors TFT2 and TFT6; a signal line such as a gate line configured to transmit a signal for driving the pixel; and the like. The first gate pattern may be formed by using a metal, an alloy, metal nitride, conductive metal oxide, a transparent conductive material, and the like. For example, the first gate pattern may be formed of a metal such as copper, aluminum, and molybdenum. In addition, the first gate pattern may have a layered structure including a plurality of layers. For example, the first gate pattern may include a copper layer and a molybdenum layer disposed on the copper layer.

The second gate insulating layer 130 may be disposed on the first gate insulating layer 120 on which the first gate pattern is disposed. The second gate insulating layer 130 may be formed by using a silicon compound such as silicon oxide ($SiO_x$), silicon nitride ($SiN_x$), silicon oxynitride ($SiO_xN_y$), silicon oxycarbide ($SiO_xC_y$), and silicon carbonitride ($SiC_xN_y$).

The second gate pattern GAT2 may be disposed on the second gate insulating layer 130. The second gate pattern GAT2 may be formed by using a metal, an alloy, metal nitride, conductive metal oxide, a transparent conductive material, and the like. For example, the second gate pattern GAT2 may be formed of a metal such as copper, aluminum, and molybdenum. In addition, the second gate pattern GAT2 may have a layered structure including a plurality of layers. For example, the second gate pattern GAT2 may include a copper layer and a molybdenum layer disposed on the copper layer.

In this case, the data spider line DSPL may include the first gate pattern and the second gate pattern that are alternately arranged. In other words, as shown in FIG. 7, two adjacent data spider lines DSPL may be formed on different respective layers, so that a line width of each of the data spider lines DSPL may be increased. Accordingly, a width W for arranging one data spider line DSPL may be decreased.

The interlayer insulating layer 140 may be disposed on the second gate insulating layer 130 on which the second gate pattern GAT2 is disposed.

The first data pattern may be disposed on the interlayer insulating layer 140. The first data pattern may include data line DL, a shielding electrode SH, and a first contact pad CP1. The first data pattern may be formed by using a metal, an alloy, metal nitride, conductive metal oxide, a transparent conductive material, and the like. For example, the first data pattern may be formed of a metal such as copper and aluminum having high conductivity. The first data pattern may have a layered structure including a plurality of layers. For example, the first data pattern may include: a titanium layer, an aluminum layer disposed on the titanium layer; and a titanium layer disposed on the aluminum layer.

The first power ELVDD may be applied to the shielding electrode SH to prevent occurrence of a coupling capacitor between the first connecting line CL1 and other pixel structures. The shielding electrode SH may be disposed between the thin film transistors TFT2 and TFT6 and the first connecting line CL1. The shielding electrode SH may be a part of the first power line extending parallel to the data line DL.

Meanwhile, the first data pattern may include a wire constituting the data spider line DSPL in the bending area BA. In other words, the data spider line DSPL may be formed with the first data pattern in the bending area BA, may be formed with the first or second gate pattern at a portion connected to the connecting line CL, and may be connected to the connecting line CL through a contact hole.

The first insulating layer 160 may be disposed on the interlayer insulating layer 140 on which the first data pattern is disposed. The first insulating layer 160 may include an organic insulating material, and may have a substantially flat top surface while sufficiently covering the first data pattern.

The connecting line pattern may be disposed on the first insulating layer 160. The connecting line pattern may include the first connecting line CL1 and a second contact pad CP2. The connecting line pattern may be formed by using a metal, an alloy, metal nitride, conductive metal oxide, a transparent conductive material, and the like.

The second insulating layer 170 may be disposed on the first insulating layer 160 on which the connecting line pattern is disposed. The second insulating layer 170 may include an organic insulating material, and may have a substantially flat top surface while sufficiently covering the connecting line pattern.

The light emitting structure 180 may include a first electrode 181, a light emitting layer 182, and a second electrode 183.

The first electrode 181 may be disposed on the second insulating layer 170. The first electrode 181 may be electrically connected to the thin film transistor TFT6 through contact holes formed through the second insulating layer 170. For example, the first electrode 181 may be connected to the thin film transistor TFT6 through the second contact pad CP2 and the first contact pad CP1.

Depending on a light emitting scheme of the display apparatus, the first electrode 181 may be formed by using a reflective material or a transmissive material. For example, the first electrode 181 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These may be used alone or in combination with each other. In some embodiments, the first electrode 181 may have a single-layer structure or a multilayer structure including a metal film, an alloy film, a metal nitride film, a conductive metal oxide film, and/or a transparent conductive material film.

The pixel defining layer PDL may be disposed on the second insulating layer 170 on which the first electrode 181 is disposed. The pixel defining layer PDL may be formed by using an organic material, an inorganic material, and the like. For example, the pixel defining layer PDL may be formed by using a photoresist, a polyacryl-based resin, a polyimide-based resin, an acryl-based resin, a silicone compound, and the like. According to some embodiments, the pixel defining layer PDL may be etched to form an opening that partially exposes the first electrode 181. A display area and a non-display area of the display apparatus may be defined by the opening of the pixel defining layer PDL. For example, a portion where the opening of the pixel defining layer PDL is located may correspond to the display area, and the non-display area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend onto a side wall of the opening of the pixel defining layer PDL. In some embodiments, the light emitting layer 182 may have a multilayer structure including an organic emission layer EL, a hole injection layer HIL, a hole transport layer HTL, an electron transport layer ETL, an electron injection layer EIL, and the like. In other embodiments, except for the organic emission layer, the hole injection layer, the hole transport layer, the electron transport layer, the electron injection layer, and the like may be commonly formed to correspond to a plurality of pixels. The organic emission layer of the light emitting layer 182 may be formed by using light emitting materials for generating different color lights such as red light, green light, and blue light according to each of the pixels of the display apparatus. According to other embodiments, the organic emission layer of the light emitting layer 182 may have a structure in which a plurality of light emitting materials for implementing different color lights such as red light, green light, and blue light are stacked to emit white light. In this case, the above light emitting structures may be commonly formed to correspond to the pixels, and the pixels may be classified by a color filter layer.

The second electrode 183 may be disposed on the pixel defining layer PDL and the light emitting layer 182. Depending on the light emitting scheme of the display apparatus, the second electrode 183 may include a transmissive material or a reflective material. For example, the second electrode 183 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These may be used alone or in combination with each other. In some embodiments, the second electrode 183 may also have a single-layer structure or a multilayer structure including a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent moisture and oxygen from penetrating from an outside. The thin film encapsulation layer TFE may include at least one organic layer and at least one inorganic layer. The at least one organic layer and the at least one inorganic layer may be alternately stacked on each other. For example, the thin film encapsulation layer TFE may include two inorganic layers and an organic layer disposed therebetween, but the embodiments are not limited thereto. In other embodiments, a sealing substrate may be provided instead of the thin film encapsulation layer to block outside air and moisture from penetrating into the display apparatus.

Figure 8:
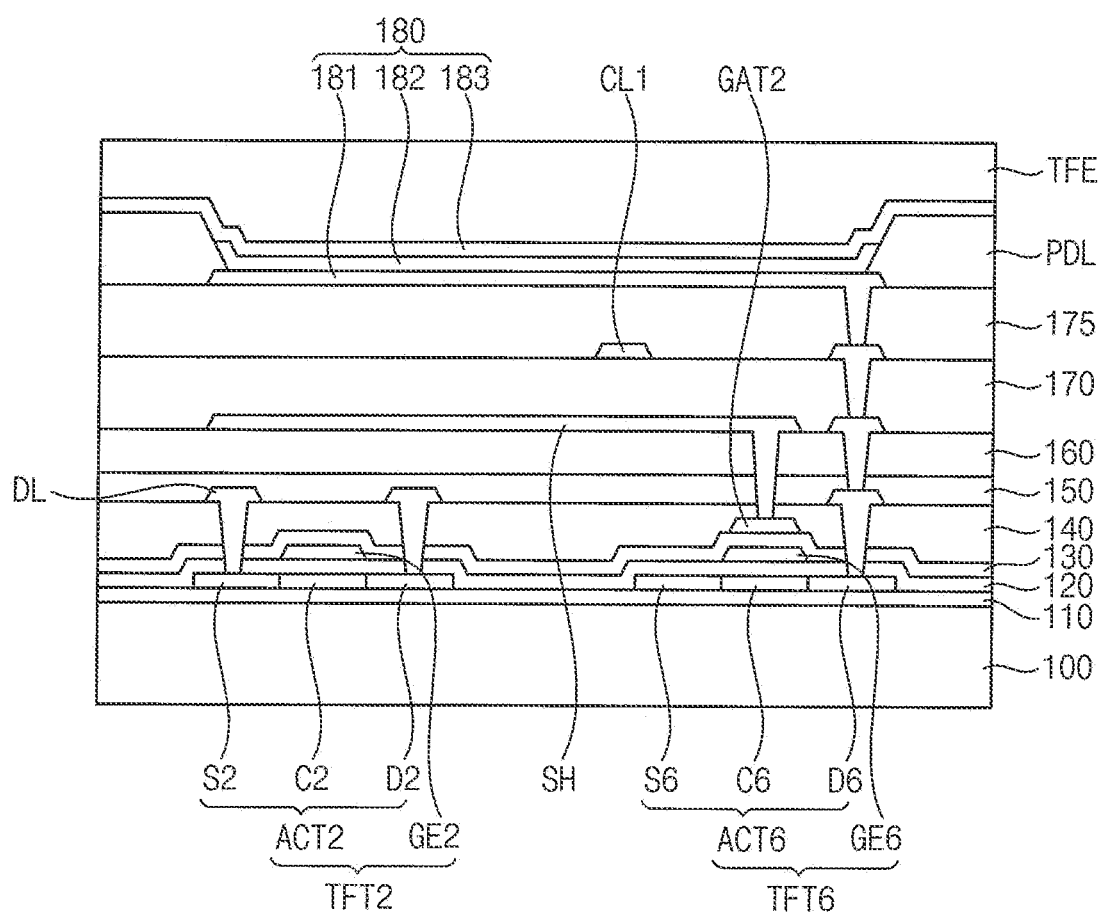
FIG. 8 is a sectional view showing a display apparatus according to embodiments.

FIG. 8 is a sectional view showing a display apparatus according to embodiments.

Referring to FIG. 8, a display apparatus is substantially the same as the display apparatus of FIG. 6 except that the display apparatus further includes an inorganic insulating layer 150, and the shielding electrode SH overlaps the data line DL. Therefore, redundant descriptions thereof will be omitted.

The display apparatus may further include an inorganic insulating layer 150 disposed between the interlayer insulating layer 140 and the first insulating layer 160. The inorganic insulating layer 150 may include an inorganic insulating material.

The shielding electrode SH may overlap the first connecting line CL1 and the data line DL. Accordingly, the shielding electrode SH may shield the data line DL as well as the first connecting line CL1, so that occurrence of a coupling capacitor between different pixel structures may be prevented.

Figure 10:
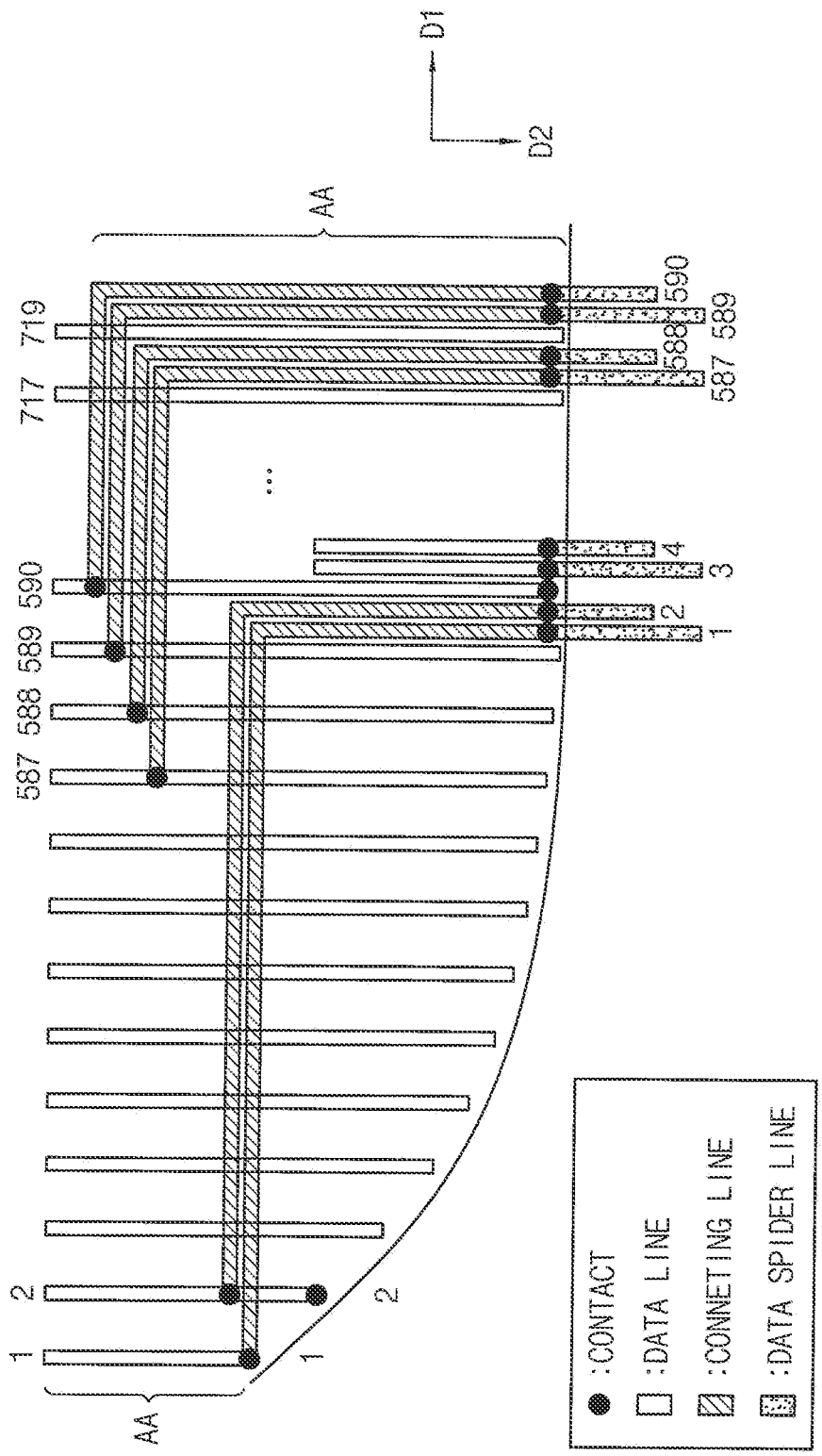
FIG. 10 is a diagram for describing a connection relation between a data line and a connecting line of the display apparatus of FIG. 9.

FIG. 9 is an enlarged view showing a lower left portion of a display apparatus according to embodiments, and FIG. 10 is a diagram for describing a connection relation between a data line and a connecting line of the display apparatus of FIG. 9.

Referring to FIGS. 1, 9, and 10, a display apparatus is substantially the same as the display apparatus of FIGS. 4 and 5 except that the connection contact hole through which the connecting line and the data line are connected to each other is disposed in the display area other than the peripheral area so that the data lines electrically connected to the data spider lines are sequentially arranged. Therefore, redundant descriptions thereof will be omitted.

A first connecting line CL1 may be connected to the first data line DL1 through a first connection contact hole CCNT1 disposed in the display area AA. The first connecting line CL1 may include: a portion CL1$b$ extending in a first direction D1; and a portion CL1$c$ extending in a second direction D2 that is perpendicular to the first direction D1.

Referring again to FIG. 10, the data lines DATA LINE may be electrically connected to the data spider lines DATA SPIDER LINE in the same order as the data spider lines DATA SPIDER LINE are arranged. Accordingly, unlike the display apparatus of FIGS. 4 and 5, it is unnecessary to change an order of output signals of a data driving chip that is connected to the data spider line, and a generally-designed data driving chip may be used.

Figure 11:
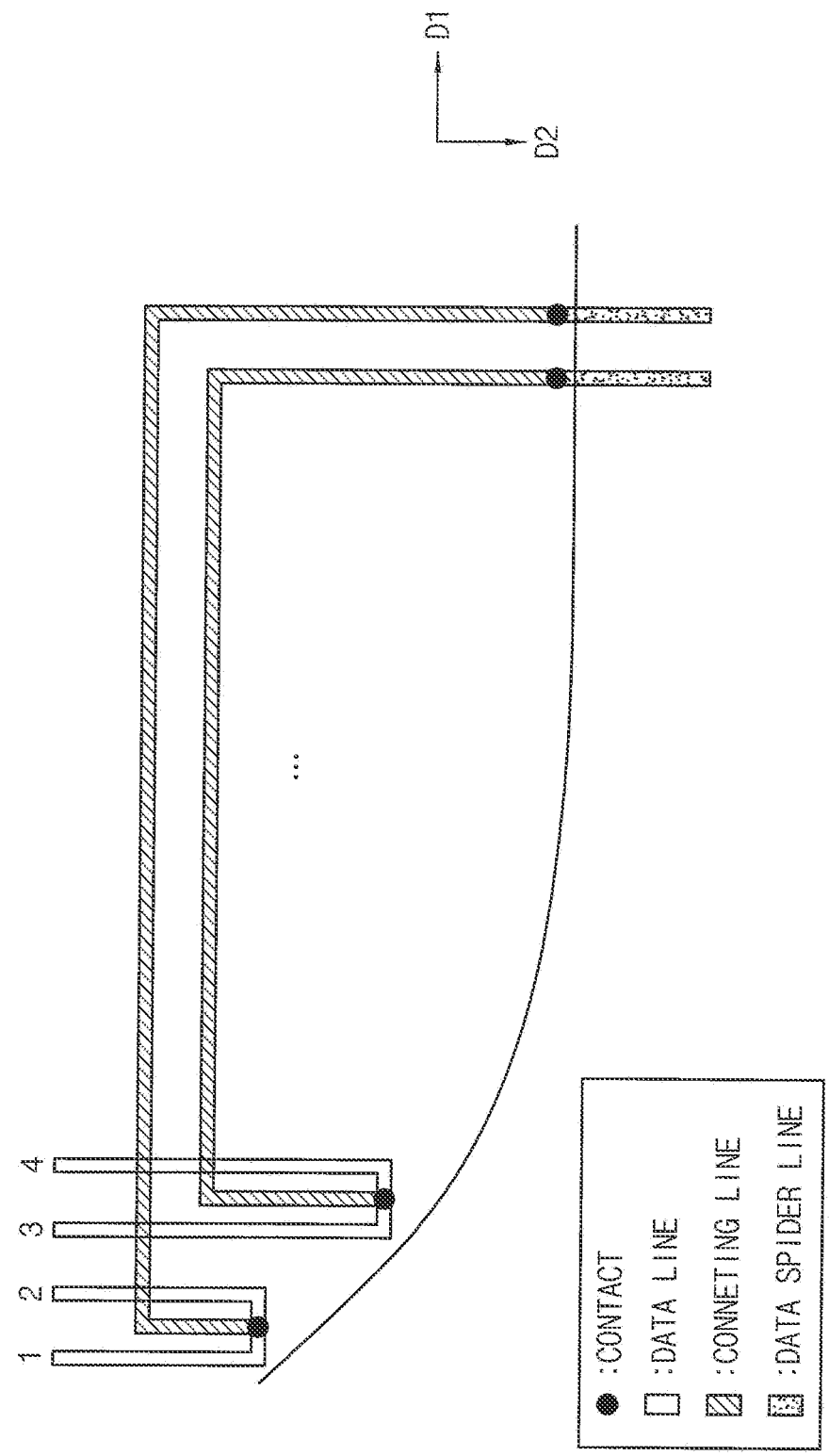
FIG. 11 is a diagram for describing a connection relation between a data line and a connecting line of a display apparatus according to embodiments.

FIG. 11 is a diagram for describing a connection relation between a data line and a connecting line of a display apparatus according to embodiments.

Referring to FIG. 11, a display apparatus may be substantially the same as the display apparatus of FIGS. 4 and 5 except that one connecting line CONNECTING LINE is connected to two data lines DATA LINE. Since one connecting line and one data spider line DATA SPIDER LINE correspond to the two data lines, some embodiments may correspond to, for example, a display apparatus to which a demultiplexer (demux) structure is applied. Accordingly, the number of connecting lines arranged in the display area may be reduced.

Figure 12:
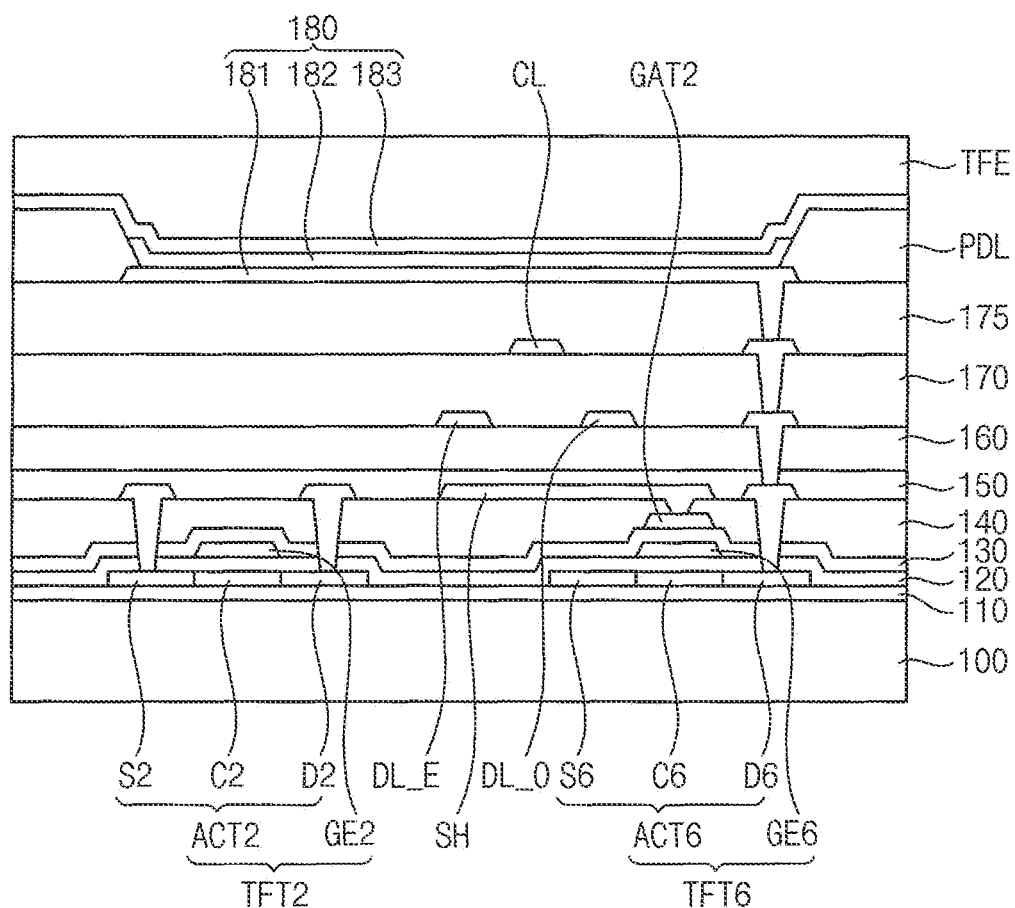
FIG. 12 is a sectional view showing a display apparatus according to embodiments.
Figure 13:
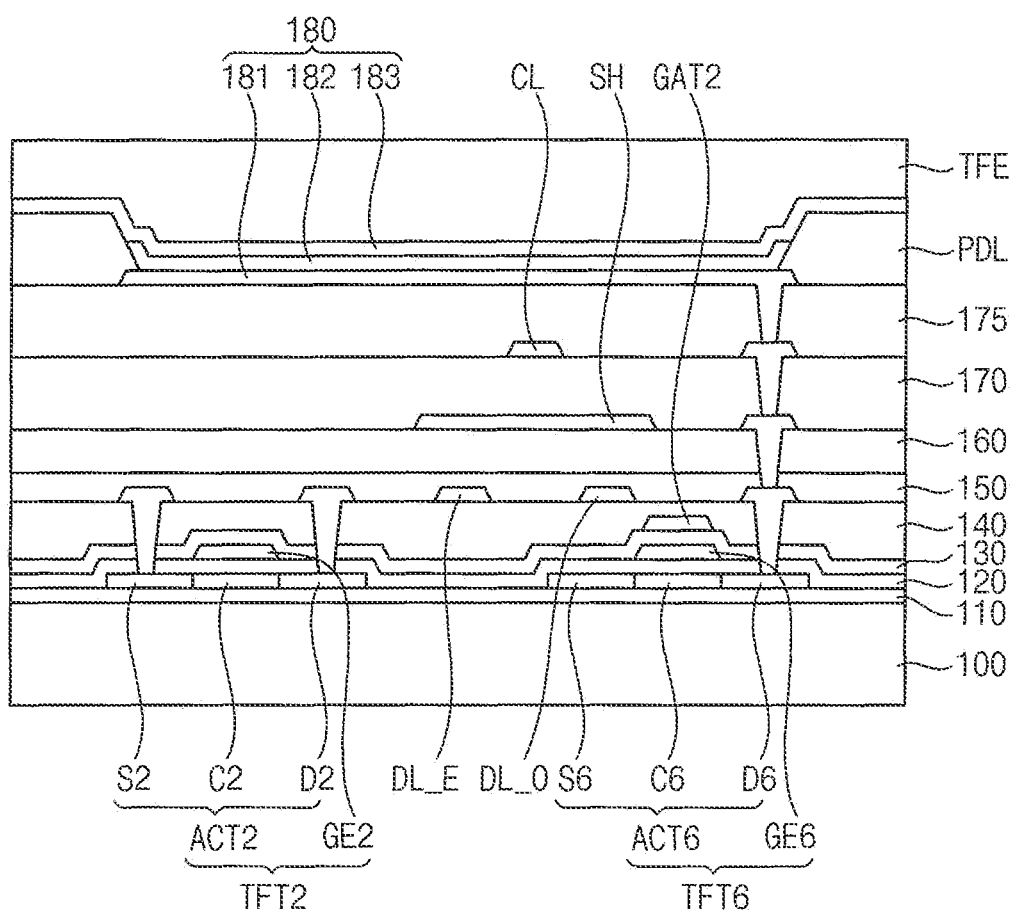
FIG. 13 is a sectional view showing a display apparatus according to embodiments.
Figure 14:
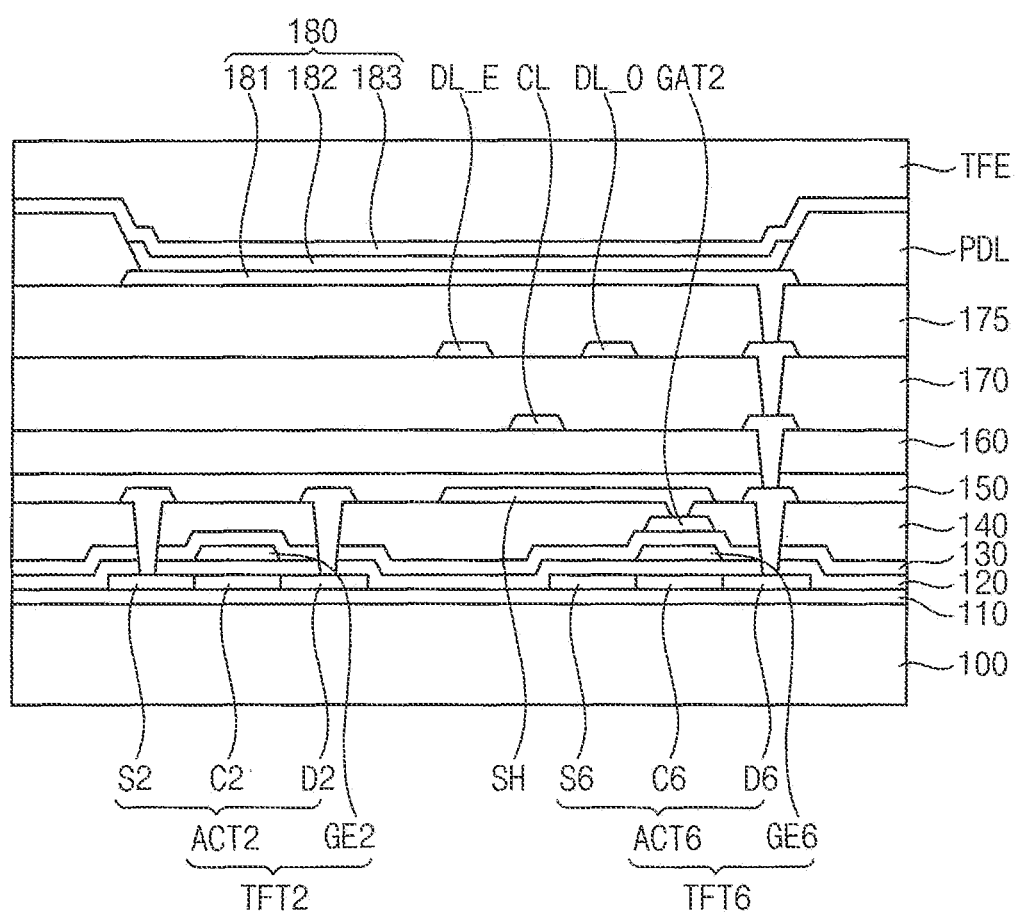
FIG. 14 is a sectional view showing a display apparatus according to embodiments.
Figure 15:
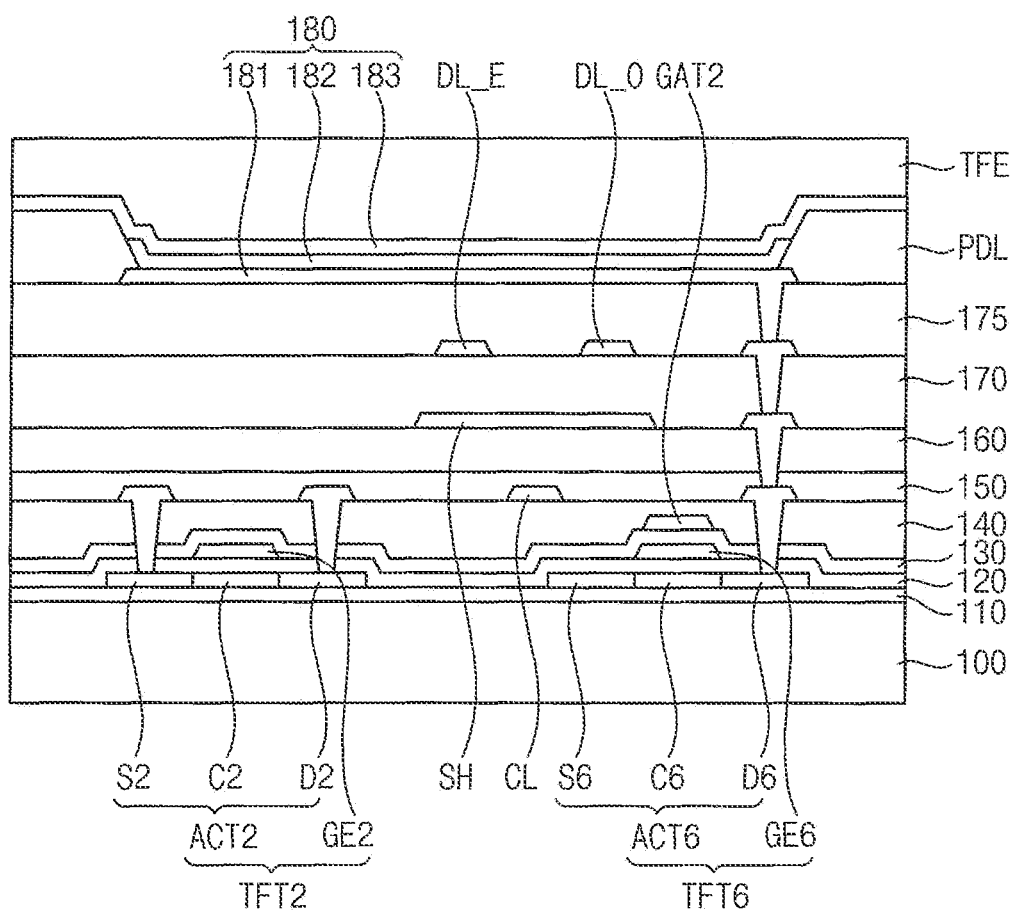
FIG. 15 is a sectional view showing a display apparatus according to embodiments.

FIG. 12 is a sectional view showing a display apparatus according to embodiments, FIG. 13 is a sectional view showing a display apparatus according to embodiments, FIG. 14 is a sectional view showing a display apparatus according to embodiments, and FIG. 15 is a sectional view showing a display apparatus according to embodiments.

FIGS. 12 to 15 illustrate embodiments of display apparatuses in which positions of the connecting line CL, data lines DL_E and DL_O, and the shielding electrode SH are variously changed. In this case, the data lines may include even-numbered data lines DL_E and odd-numbered data lines DL_O, and some embodiments may correspond to a display apparatus to which a two-data-line (TDL) structure where two data lines correspond to one pixel, a demultiplexer (demux) structure, or the like is applied.

Figure 16:
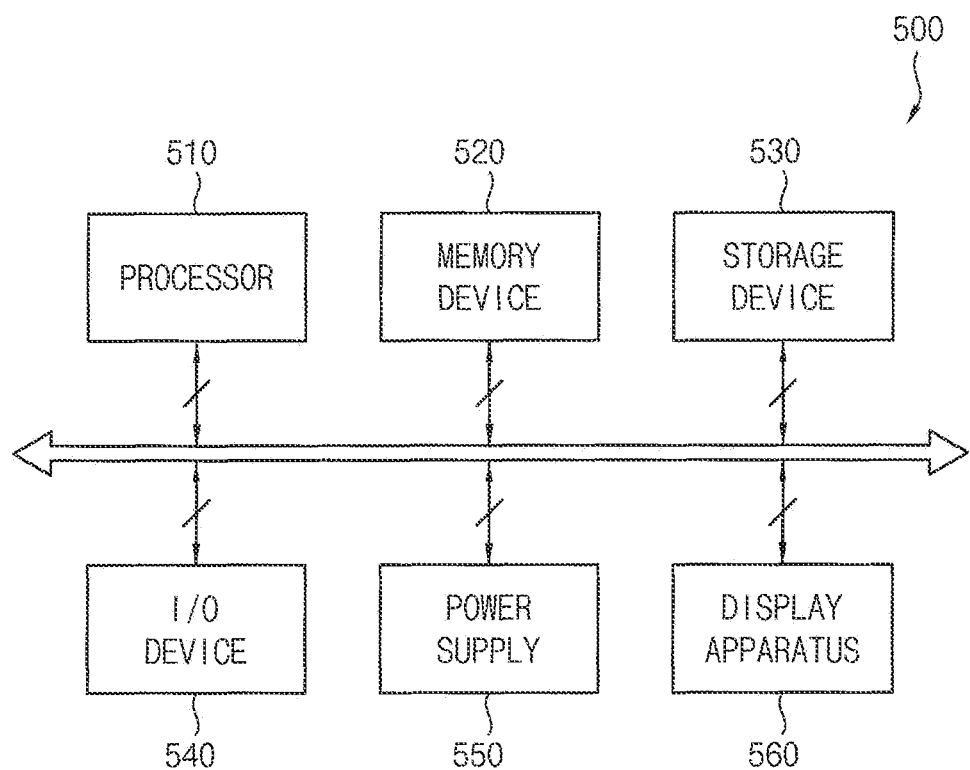
FIG. 16 is a block diagram illustrating an electronic device according to embodiments.
Figure 17A:
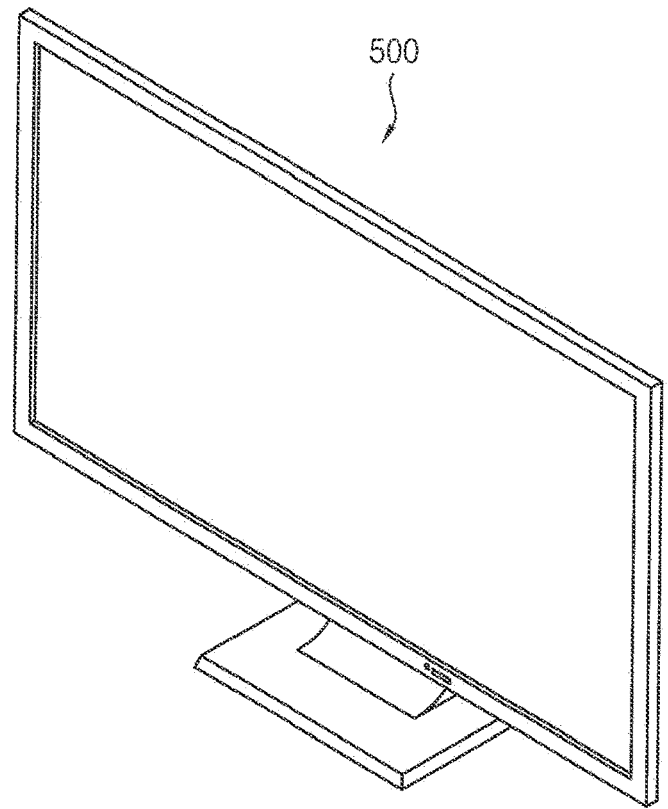
FIG. 17A is a diagram illustrating an example in which the electronic device of FIG. 16 is implemented as a television.
Figure 17B:
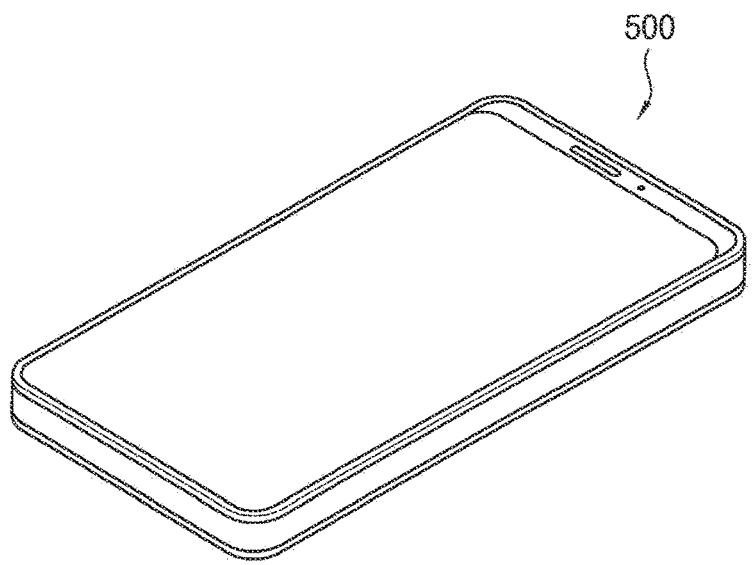
FIG. 17B is a diagram illustrating an example in which the electronic device of FIG. 16 is implemented as a smart phone.

FIG. 16 is a block diagram illustrating an electronic device according to embodiments, FIG. 17A is a diagram illustrating an example in which the electronic device of FIG. 16 is implemented as a television, and FIG. 17B is a diagram illustrating an example in which the electronic device of FIG. 16 is implemented as a smart phone.

Referring to FIGS. 16 to 17B, the electronic device 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic device 500 may further include a plurality of ports for communicating with a video card, a sound card, a memory card, a universal serial bus (USB) device, other electronic devices, etc. In some embodiments, as illustrated in FIG. 17A, the electronic device 500 may be implemented as a television. In other embodiments, as illustrated in FIG. 17B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic device 500.

The display apparatus 560 may be coupled to other components via the buses or other communication links. In some embodiments, the I/O device 540 may include the display apparatus 560. As described above, the display apparatus 560 may have a structure in which a data spider line for a part of an edge of a display area is connected to a data line through a connecting line, so that a width of a bezel, which is a non-display area, at an L-cut part (see FIG. 4, etc.) of the edge of the display device may be reduced. In addition, the connecting line may be shielded from other signal wires by the shielding electrode. Since these are described above, duplicated description related thereto will not be repeated.

The present disclosure may be applied to a display apparatus (e.g., an organic light emitting display device and the like) and an electronic device including the display apparatus. For example, the present disclosure may be applied to a smart phone, a cellular phone, a video phone, a smart pad, a smart watch, a tablet PC, a car navigation system, a television, a computer monitor, a laptop, a head mounted display apparatus, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

THE DESCRIPTION OF THE REFERENCE NUMERALS

100: base substrate
110: buffer layer

120: first gate insulating layer
130: second gate insulating layer
140: interlayer insulating layer
160: first insulating layer
170: second insulating layer
180: light emitting structure
TFT: thin film transistor
CL: connecting line
DL: data line

The invention claimed is:

1. A display apparatus including a display area for displaying an image and a peripheral area that is a non-display area, the display apparatus comprising:
   a base substrate;
   a first data line in the display area on the base substrate;
   a first connecting line at least partially in the display area on the base substrate, comprising a second portion extending in a first direction and a first portion extending in a second direction crossing the first direction, and electrically connected to the first data line through a connection contact hole;
   a data pad in the peripheral area; and
   a first data spider line in the peripheral area between the data pad and the display area and electrically connected to the first connecting line and the data pad.

2. The display apparatus of claim 1, wherein the base substrate is a flexible substrate,
   wherein the display apparatus further comprises a bending area between the data pad and the display area and extending in the first direction parallel to an edge of the display area, and
   wherein the first data spider line is in the peripheral area between the bending area and the display area and linearly extends in the second direction perpendicular to the first direction.

3. The display apparatus of claim 2, wherein a length of the bending area in the first direction is smaller than a length of the display area in the first direction.

4. The display apparatus of claim 2, further comprising:
   a plurality of data lines in the display area on the base substrate and extending parallel to the first data line; and
   a plurality of data spider lines in the peripheral area between the data pad and the display area, respectively electrically connected to the data lines, and extending parallel to the first data spider line,
   wherein both the first data spider line and the data spider lines extend in the second direction.

5. The display apparatus of claim 1, wherein the connection contact hole is in the peripheral area.

6. The display apparatus of claim 5, wherein the first data line extends in the second direction that is perpendicular to the first direction, and
   wherein the first connecting line includes a third portion parallel to the first portion.

7. The display apparatus of claim 1, wherein the connection contact hole is in the display area.

8. The display apparatus of claim 1, further comprising a second data line in the display area on the base substrate and adjacent to the first data line,
   wherein the first and second data lines are connected to each other in the peripheral area and electrically connected to the first connecting line.

9. The display apparatus of claim 1, further comprising:
   an $(n-1)^{th}$ data line, an $n^{th}$ data line, and an $(n+1)^{th}$ data line that are parallel to the first data line and that are sequentially arranged in the first direction,
   wherein an $n^{th}$ pad electrically connected to the $n^{th}$ data line, an $(n-1)^{th}$ pad electrically connected to the $(n-1)^{th}$ data line, an $(n+1)^{th}$ pad electrically connected to the $(n+1)^{th}$ data line, and a first pad electrically connected to the first data line are in the data pad in the first direction.

10. The display apparatus of claim 9, further comprising:
    an $(n-1)^{th}$ connecting line at least partially in the display area on the base substrate and electrically connected to the $(n-1)^{th}$ data line through another connection contact hole;
    an $(n-1)^{th}$ data spider line in the peripheral area between the data pad and the display area and electrically connected to the $(n-1)^{th}$ connecting line and the data pad;
    an $n^{th}$ data spider line in the peripheral area between the data pad and the display area and electrically connected to the $n^{th}$ data line and the data pad; and
    an $(n+1)^{th}$ data spider line in the peripheral area between the data pad and the display area and electrically connected to the $(n+1)^{th}$ data line and the data pad.

11. The display apparatus of claim 1, wherein the peripheral area includes a left peripheral area adjacent to a left side of the display area, a right peripheral area adjacent to a right side of the display area, an upper peripheral area adjacent to an upper side of the display area, and a lower peripheral area adjacent to a lower side of the display area, and
    wherein the data pad is in the lower peripheral area.

12. The display apparatus of claim 1, further comprising:
    a thin film transistor electrically connected to the first data line;
    a first electrode electrically connected to the thin film transistor;
    a second electrode over the first electrode; and
    a light emitting layer between the first electrode and the second electrode.

13. The display apparatus of claim 12, further comprising a shielding electrode that overlaps the first connecting line,
    wherein a first power or a second power is applied to the shielding electrode.

14. The display apparatus of claim 1, wherein the first connecting line and the first data spider line are connected to each other through a spider contact hole formed in the peripheral area.

15. A display apparatus comprising:
    a base substrate;
    a thin film transistor on the base substrate;
    a first data line electrically connected to the thin film transistor;
    a first connecting line comprising a first part extending in a first direction, and a second part extending in a second direction that is substantially perpendicular to the first direction the first connecting line being electrically connected to the first data line at a distal end of either the first part or the second part;
    a first insulating layer between the first data line and the first connecting line and having a first connection contact hole through which the first data line and the first connecting line are connected to each other, and
    a shielding electrode that overlaps the first connecting line.

16. The display apparatus of claim 15, wherein the thin film transistor includes an active pattern on the base substrate and a gate electrode that overlaps the active pattern, and wherein the display apparatus further comprises a first data spider line formed on a same layer as the gate electrode and electrically connected to the first connecting line.

17. The display apparatus of claim 15, wherein the shielding electrode is between the thin film transistor and the first connecting line.

18. The display apparatus of claim 15, wherein the shielding electrode overlaps the first data line.

19. The display apparatus of claim 15, further comprising a second data line adjacent to the first data line and extending parallel to the first data line, wherein the first data line and the second data line are electrically connected to the first connecting line, and wherein the shielding electrode overlaps the first data line and the second data line.

20. A display apparatus comprising:

a base substrate;

first and second data lines on the base substrate;

a first connecting line connected to the first data line through a contact hole, and comprising a first part extending in a first direction, and a second part extending in a second direction that is substantially perpendicular to the first direction the first connecting line being electrically connected to the first data line through a contact hole at a distal end of either the first part or the second part;

a first data spider line connected to the first connecting line through another contact hole;

a second data spider line connected to the second data line through a contact hole; and a data pad electrically connected to the first data spider line and the second data spider line and connected to a data driving chip.

\* \* \* \* \*